(12) United States Patent
Hecht

(10) Patent No.: US 7,394,286 B2
(45) Date of Patent: *Jul. 1, 2008

(54) FIELD PROGRAMMABLE GATE ARRAY LONG LINE ROUTING NETWORK

(75) Inventor: Volker Hecht, Barsinghausen (DE)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/692,717

(22) Filed: Mar. 28, 2007

(65) Prior Publication Data

US 2007/0164786 A1 Jul. 19, 2007

Related U.S. Application Data

(63) Continuation of application No. 11/028,471, filed on Dec. 31, 2004, now Pat. No. 7,212,030.

(51) Int. Cl.
*H03K 19/173* (2006.01)
(52) U.S. Cl. .......................................... 326/38; 326/82
(58) Field of Classification Search .............. 326/37–41
See application file for complete search history.

(56) References Cited

U.S. PATENT DOCUMENTS

| | | |
|---|---|---|
| 5,594,363 A | 1/1997 | Freeman et al. |
| 5,847,580 A | 12/1998 | Bapat et al. |
| 5,942,913 A | 8/1999 | Young et al. |
| 6,031,388 A | 2/2000 | Dobbelaere |
| 6,107,827 A | 8/2000 | Young et al. |
| 6,130,550 A | 10/2000 | Zaliznyak et al. |
| 6,204,689 B1 | 3/2001 | Percey et al. |
| 6,246,259 B1 | 6/2001 | Zaliznyak et al. |
| 6,396,303 B1 | 5/2002 | Young |
| 6,870,395 B2 | 3/2005 | Schadt et al. |
| 2005/0091630 A1 | 4/2005 | Madurawe |

*Primary Examiner*—Don P Le
(74) *Attorney, Agent, or Firm*—Lewis and Roca, LLP

(57) ABSTRACT

A multi-directional routing repeater has a plurality of buffers, each of the plurality of buffers has an input and an output. The output of each of the plurality of buffers is connected to a separate routing line for transmitting a signal in a separate direction of a first set of routing lines, and the input of each of the plurality of buffers is connected to one of a first set of programmable switches, one of a second set of programmable switches, one of a third set of programmable switches, and one of a fourth set of programmable switches, and each one of the first set of programmable switches is connected to a separate one of the second set of programmable switches and a separate one of the second set of programmable switches, none of which are connected to an input of a same one of the plurality of buffers. Each one of the first set of programmable switches is connected to a separate routing line for transmitting a signal in a separate direction of a second set of routing lines.

5 Claims, 3 Drawing Sheets

FIELD PROGRAMMABLE GATE ARRAY LONG LINE ROUTING NETWORK

CROSS-REFERENCE TO RELATED APPLICATIONS

This application is a continuation of co-pending U.S. patent application Ser. No. 11/028,471, filed Dec. 31, 2004, the entirety of which is hereby incorporated by reference in it's entirety.

BACKGROUND OF THE INVENTION

1. Field Of The Invention

The present invention relates to a routing network in a field programmable gate array (FPGA) architecture. More particularly, the present invention relates to a long line routing network employing unidirectional buffers for driving signals onto sets of parallel long routing lines.

2. The Background Art

Programmable logic devices (PLDs) are integrated circuit devices which contain gates or other general-purpose cells whose interconnections can be configured by programming to implement nearly any desired combinatorial or sequential function. Field programmable gate arrays (FPGAs) are well known in the PLD art. FPGAs generally include an array of general-purpose logic circuits, typically referred to as logic blocks, which can be programmed by programmable elements to implement virtually any logic function. The programmed logic elements in the gate array are connected together by routing resources to form a desired integrated circuit. The routing resources are connected to each other and to the logic elements in the gate array by programmable elements.

It is well known in the art that both volatile and non-volatile programmable elements have been used to provide interconnection in FPGA devices. Volatile programmable elements are often a pass transistor controlled by a static random access memory (SRAM) cell. Nonvolatile programmable elements include antifuses and floating gate transistors. Programmable antifuse based architectures and reprogrammable SRAM and floating gate memory cell based architectures as well known in the FPGA art.

In an SRAM based reprogrammable FPGA, the programmable elements are typically passgates controlled by information stored in an SRAM configuration memory. In an antifuse based FPGA, the antifuses are programmable elements that are formed by two conductors with a dielectric material sandwiched in between which represent an open state until programmed. The antifuses are disposed to provide the interconnections among the routing resources and to program the programmable logic elements. In a floating gate transistor based FPGA, the floating gates are typically similar to those used in flash memories the operation of which is well known to those of ordinary skill in the art, but adapted for use in programmable arrays.

A variety of schemes well known to those of ordinary skill in the art for the implementation of the routing network in an FPGA have been proposed in the art. These routing schemes have attempted to address a number of different issues including: reducing the effect of resistance in the routing lines on signal transmission in the circuit; reducing the effect of capacitance between the routing lines on signal transmission in the circuit; increasing the reliability of place and route circuit implementations; and determining the number and lengths of routing lines needed to efficiently utilize the number and granularity of available logic blocks. Granularity is understood by one of ordinary skill in the art to describe the number of inputs into a logic cell, and thereby the complexity of the logic expressions that may be implemented by the logic cell.

In Freeman et al., U.S. Pat. No. 5,594,363, a non-volatile reprogrammable based FPGA is disclosed which discusses the lengths and interconnection of various routing resources, depicted as local, long and global, and the granularity of the logic blocks. The long routing resources are channels that are bidirectional, and the signals on the channels are driven by buffers as the channels transmit the signals. As pointed out in Freeman, et al., the number of active programmable connections on a long routing line is of concern, because they require a not insignificant amount of die area, and also add to the load and capacitance on the line.

In FIG. 1, a schematic example of a known prior art bidirectional routing connection employed in a horizontal long line routing net 10 is illustrated. In the long line routing net 10, first and second horizontal routing nets 12 and 14 are each shown having a routing line, 16 and 18, respectively, being connected to the bidirectional routing connection and a vertical routing net 20 having a routing line 22, that may be connected to the routing line 18 from the second horizontal routing net 14 by a programmable switch 24. In the bidirectional routing connection, the long lines 16 and 18 may be programmably connected to the input and the output of a buffer 26 by programmable switches 28, 30, 32 and 34. The input of buffer 26 may also be programmably connected to ground by programmable switch 36.

In the operation of the bidirectional routing connection depicted in FIG. 1, signals from first horizontal routing net 12 are transmitted to second horizontal routing net 14 when programmable switches 28 and 32 are programmed to conduct, and signals from second horizontal routing net 14 are transmitted to first horizontal routing net 12 when programmable switches 30 and 34 are programmed to conduct. Signals may be transmitted between the vertical routing net 20 and the second horizontal routing net 14 when programmable switch 24 is programmed to conduct. In the event the buffer 26 is not to be used, programmable switch 24 is programmed to conduct. In the event the buffer 26 is not to be used, programmable switch 36 may be employed to pull the input of the buffer 26 to ground. Although not depicted in FIG. 1, a similar bidirectional routing connection is also known to be employed in the vertical direction for vertical long line resources. Active routing repeaters are typically used in longer routing resources, where the distance from on bidirectional routing connection to the next bidirectional routing connection is typically 4 or 8 tiles or even longer.

The bidirectionality of the routing connection is provided by the programmable switches 30 and 32 at the output of the buffer 26 as well as the programmable switches 28 and 34 at the input of the buffer 26. These programmable switches add both serial resistance and switch capacitance to the routing nets. When a very long net is being implemented there can be significant performance degradation resulting from the resistance of the switches 30 and 32 at the output of the buffer 26 due to the increased capacitance imposed by a very long net. Even though the programmable switches 30 and 32 may be implemented as several parallel switches to reduce the serial resistance, the parallel switches add more capacitance and require more die area. Accordingly, it would be advantageous to implement very long line routing nets with buffering as desired while reducing the resistance and capacitance associated with providing connectability between the long line routing nets.

BRIEF DESCRIPTION OF THE INVENTION

According to a first embodiment of the present invention, a multi-directional routing repeater has a plurality of buffers, each of the plurality of buffers has an input and an output. The output of each of the plurality of buffers is connected to a separate routing line for transmitting a signal in a separate direction of a first set of routing lines, and the input of each of the plurality of buffers is connected to one of a first set of programmable switches, one of a second set programmable switches, one of a third set of programmable switches, and one of a fourth set of programmable switches, and each one of the first set of programmable switches is connected to a separate one of the second set of programmable switches and a separate one of the second set of programmable switches, none of which are connected to an input of a same one of the plurality of buffers. Each one of the first set of programmable switches is connected to a separate routing line for transmitting a signal in a separate direction of a second set of routing lines.

According to a second embodiment of the present invention, a field programmable gate array long line bus architecture has a plurality of multi-directional routing repeaters, and each of the plurality of multi-directional routing repeaters is disposed at a separate tile boundary for each tile in the field programmable gate array. A plurality of pairs of unidirectional routing lines of uniform length, each of the plurality of pairs has a first routing lines in each of the pairs for transmitting a signal in a first direction and a second routing line in each of the pairs for transmitting a signal in a second direction, and each of the plurality of pairs of unidirectional routing lines begins at a separate one of the plurality of multi-directional routing repeaters.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Generally, in a reprogrammable FPGA architecture suitable for incorporating the present invention, there is included an array of programmable logic blocks, routing resources for connecting the programmable logic blocks together, an array of routing switch memory cells whose contents are employed to connect the routing resources together, and static configuration memory cells for programming the logic devices. The logic blocks are often grouped into a unit referred to as a tile. In different FPGA architectures, the tiles may be of various sizes depending on a variety of factors. Typically, however, a tile is recognized as a block containing one logic block as well as the routing resources, including programmable switches and partial nets that are disposed in the vicinity of the logic block. For interconnection between tiles, interconnect resources of various lengths are often employed. Any interconnect resource that runs for a distance greater than one tile may be referred to as a long line, but typically a long line will run for a distance that is greater than the minimum distance of more than one tile.

Figure 2:
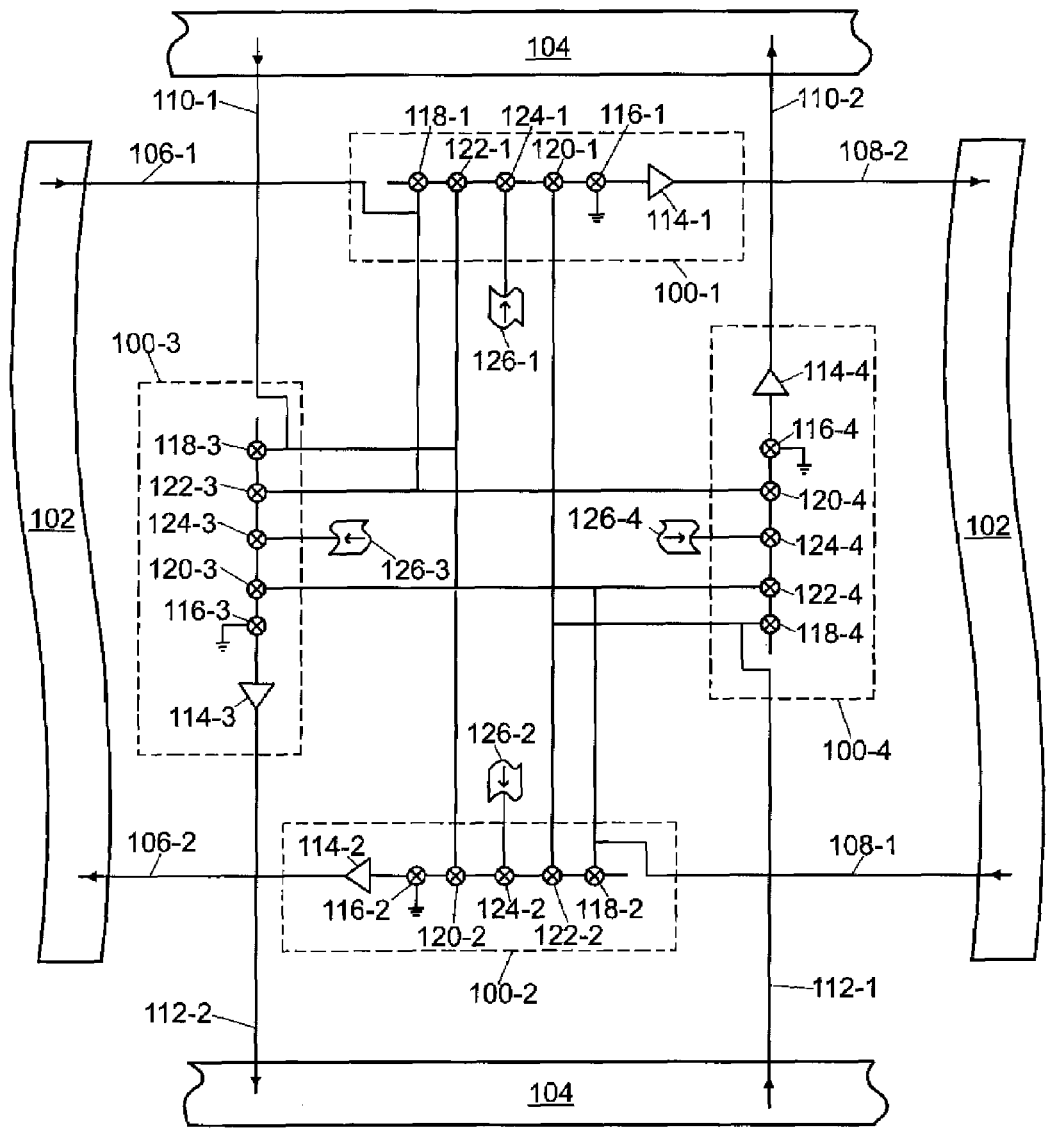
FIG. 2 illustrates schematically a set of four of unidirectional routing repeaters for connecting parallel sets of long line routing nets according to the present invention.

In FIG. 2, a multi-directional routing repeater including first, second, third, and fourth unidirectional routing repeaters 100-1, 100-2, 100-3 and 100-4 for programmably connecting parallel sets of long routing lines according to the present invention is illustrated. Also depicted are horizontal long line routing net 102 and vertical long line routing net 104. It will be appreciated by those of ordinary skill in the art that the terms horizontal and vertical are employed to enhance the readability of the application and should be generally understood to indicate first and second orientations.

Both the horizontal long line routing net 102 and the vertical long line routing net 104 have pairs of long lines such that one of the long lines in each pair transmit a signal in a first direction and a second one in the pair transmits a signal in a second direction. The horizontal long line routing net 102 includes a first pair of horizontal long routing lines 106-1 and 106-2 and a second pair of horizontal long routing lines 108-1 and 108-2+. The vertical long line routing net 104 includes a first pair of vertical long routing lines 110-1 and 110-2 and a second pair of vertical long routing lines 112-1 and 112-2.

First unidirectional routing repeater 100-1 has a buffer 114-1, programmable grounding switch 116-1, programmably horizontal switch 118-1, and first and second programmable vertical-to-horizontal switches 120-1 and 122-1. A programmable switch 124-1 for connection an illustrative separate routing net 126-1 may also, according to another aspect of the present invention, be included in the first unidirectional routing repeater 100-1. A first terminal of each of programmable grounding switch 116-1, programmable horizontal switch 118-1, first and second programmable vertical-to-horizontal switches 120-1 and 122-1, and programmable switch 124-1 are connected to the input of buffer 114-1.

Second unidirectional routing repeater 100-2 has a buffer 114-2, programmable grounding switch 116-2, programmable horizontal switch 118-2, and first and second programmable vertical-to-horizontal switches 120-2 and 122-2. A programmable switch 124-2 for connecting an illustrative separate routing net 126-2 may also, according to another aspect of the present invention, be included in the second unidirectional routing repeater 100-2. A first terminal of each of programmable grounding switch 116-2, programmable horizontal switch 118-2, first and second programmable vertical-to-horizontal switches 120-2 and 122-2, and programmable switch 124-2 are connected to the input of buffer 114-2.

Third unidirectional routing repeater 100-3 has a buffer 114-3, programmable grounding switch 116-3, programmable vertical switch 118-3, and first and second programmable horizontal-to-vertical switches 120-3 and 122-3. A programmable switch 124-3 for connecting an illustrative separate routing net 126-3 may also, according to another aspect of the present invention, be included in the third unidirectional routing repeater 100-3. A first terminal of each of programmable grounding switch 116-3, programmable vertical switch 118-3, first and second programmable horizontal-to-vertical switches 120-3 and 122-3, and programmable switch 124-3 are connected to the input of buffer 114-3.

Fourth unidirectional routing repeater 100-4 has a buffer 114-4, programmable grounding switch 116-4, programmable vertical switch 118-4, and first and second programmable horizontal-to-vertical switches 120-4 and 122-4. A programmable switch 124-4 for connecting an illustrative separate routing net 126-4 may also, according to another aspect of the present invention, be included in the fourth unidirectional routing repeater 100-4. A first terminal of each of programmable grounding switch 116-4, programmable vertical switch 118-4, first and second programmable horizontal-to-vertical switches 120-4 and 122-4, and programmable switch 124-4 are connected to the input of buffer 114-4.

Figure 1:
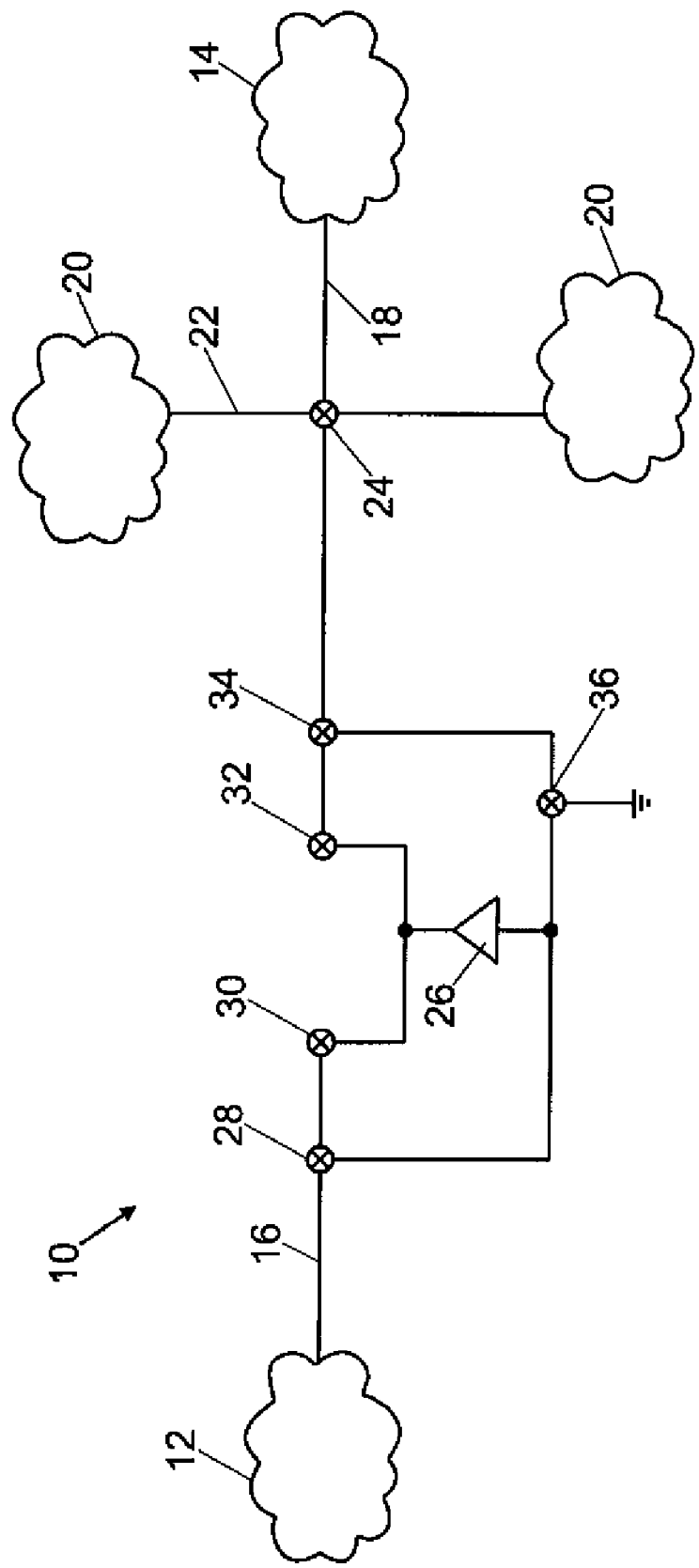
FIG. 1 illustrates schematically a bidirectional routing connection for long line routing nets according to the prior art.

According to the present invention, it should be appreciated that there are no switches at the outputs of buffers 114-1 through 114-4. This is in contrast to the prior art as illustrated by the output switches 30 and 32 seen with reference to FIG. 1. This removes any serial resistance imposed by switches 30 and 32, as well as their capacitance.

The horizontal long routing line 106-1 is connected to a second terminal of programmable horizontal switch 118-1, a second terminal of second programmable horizontal-to-vertical switch 122-3, and a second terminal of first programmable horizontal-to-vertical switch 120-4. A second terminal of programmable grounding switch 116-1 is connected to ground, and a second terminal of programmable grounding switch 124-1 is connected to the separate routing net 126-1. It will be appreciated by those of ordinary skill in the art that routing net 126-1 is illustrative of any number of routing lines of routing nets of different routing networks that could be connected to the input of buffer 114-1 by programmable switches in a manner similar to the connection by programmable switch 124-1. The horizontal long routing line 106-2 is connected to the output of buffer 114-2.

The horizontal long routing line 108-1 is connected to a second terminal of programmable horizontal switch 118-2, a second terminal of second programmable horizontal-to-vertical switch 122-4, and a second terminal of first programmable horizontal-to-vertical switch 120-3. A second terminal of programmable grounding switch 116-2 is connected to ground, and a second terminal of programmable switch 124-2 is connected to the separate routing net 126-2. It will be appreciated by those of ordinary skill in the art that routing net 126-2 is illustrative of any number of routing lines of routing nets of different routing networks that could be connected to the input of buffer 114-2 by programmable switches in a manner similar to the connection by programmable switch 124-2. The horizontal long routing line 108-2 is connected to the output of buffer 114-1.

The vertical long routing line 110-1 is connected to a second terminal of programmable vertical switch 118-3, a second terminal of second programmable vertical-to-horizontal switch 122-1, and a second terminal of first programmable horizontal-to-vertical switch 120-2. A second terminal of programmable grounding switch 116-3 is connected to ground, and a second terminal of programmable switch 124-3 is connected to the separate routing net 126-3. It will be appreciated by those of ordinary skill in the art that routing net 126-3 is illustrative of any number of routing lines of routing nets of different routing networks that could be connected to the input of buffer 114-3 by programmable switches in a manner similar to the connection by programmable switch 124-3. The vertical long routing line 110-2 is connected to the output of buffer 114-4.

The vertical long routing line 112-1 is connected to a second terminal of programmable vertical switch 118-4, a second terminal of second programmable vertical-to-horizontal switch 122-2, and a second terminal of first programmable horizontal-to-vertical switch 120-1. A second terminal of programmable grounding switch 116-4 is connected to ground, and a second of programmable switch 124-4 is connected to the separate routing net 126-4 is illustrative of any number of routing lines of routing nets of different routing networks that could be connected to the input of buffer 114-4 by programmable switches in a manner similar to the connection by programmable switch 124-4. The vertical long routing line 112-2 is connected to the output of buffer 114-3.

According to the present invention, programmable switches 116 through 124 preferably include non-volatile transistors. It should be appreciated that a variety of non-volatile memory devices well known to those of ordinary skill in the art may be employed according to the present invention including floating gate devices such as EEPROM, flash EEPROM, silicon nanocrystal MOS transistors, and floating trap devices such as SONOS and MONOS. To avoid over-complicating the disclosure and thereby obscuring the present invention descriptions of the above mentioned non-volatile memory devices are not made herein. It should be further appreciated that other known switching devices such as SRAM controlled pass gates and antifuses may be suitable according to the present invention.

In the operation of unidirectional routing repeater 100-1, the buffer 114-1 can drive a signal from horizontal routing line 106-1 when programmable horizontal switch 118-1 is turned on, from vertical line 110-1 when second programmable vertical-to-horizontal switch 122-1 is turned on, from vertical line 112-1 when first programmable vertical-to-horizontal switch 122-1 is turned on, from vertical line 112-1 when first programmable vertical-to-horizontal switch 120-1 is turned on, or from an alternative routing net 126-1 when programmable switch 124-1 is turned on. Otherwise, the buffer 114-1 can be tied to ground when programmable grounding switch 116-1 is turned on.

In the operation of unidirectional routing repeater 100-2, the buffer 114-2 can drive a signal from horizontal routing line 108-1 when programmable horizontal switch 1418-2 is turned on, from vertical line 110-1 when first programmable vertical-to-horizontal switch 120-2 is turned on, from vertical line 112-1 when second programmable vertical-to-horizontal switch 122-2 is turned on, or from an alternative routing net 126-2 when programmable switch 124-2 is turned on. Otherwise, the buffer 114-2 can be tied to ground when programmable grounding switch 116-2 is turned on.

In the operation of unidirectional routing repeater 100-3, the buffer 114-3 can drive a signal from vertical routing line 110-1 when programmable vertical switch 118-3 is turned on, from horizontal routing line 106-1 when second programmable horizontal-to-vertical switch 122-3 is turned on, from horizontal routing line 108-1 when first programmable horizontal-to-vertical switch 120-3 is turned on, or from an alternative routing net 126-3 when programmable switch 124-3 is turned on. Otherwise, the buffer 114-3 can be tied to ground when programmable grounding switch 116-3 is turned on.

In the operation of unidirectional routing repeater 100-4, the buffer 114-4 can drive a signal from vertical routing line 112-1 when programmable vertical switch 118-4 is turned on, from horizontal routing line 106-1 when first programmable horizontal-to-vertical switch 120-4 is turned on, from horizontal routing line 108-1 when second programmable horizontal-to-vertical switch 122-4 is turned on, or from an alternative routing net 126-4 when programmable switch 124-4 is turned on. Otherwise, the buffer 114-4 can be tied to ground when programmable grounding switch 116-4 is turned on.

It should be further appreciated that the unidirectional routing repeaters 100-1 through 100-4 may individually and independently select the nets from which signals are transmitted to the routing lines 106-2, 108-2, 110-2 and 112-2. Accordingly, the same signal may be transmitted to more than one of the routing lines 106-2, 108-2, 110-2 and 112-2. For example, by turning on first programmable vertical-to-horizontal switch 120-2 and second programmable vertical-to-horizontal switch 122-1 simultaneously, a signal on vertical routing line 110-1 would be routed through buffers 114-1 and 114-2 simultaneously to the right and to the left in horizontal direction onto lines 108-2 and 106-2, respectively. In another example, by turning on programmable horizontal switches 118-1 and 118-2 simultaneously, a first signal is buffered in a first horizontal direction from 106-1 onto 108-2, while a second signal is buffered in a second horizontal direction from 108-1 to 106-2.

Figure 3:
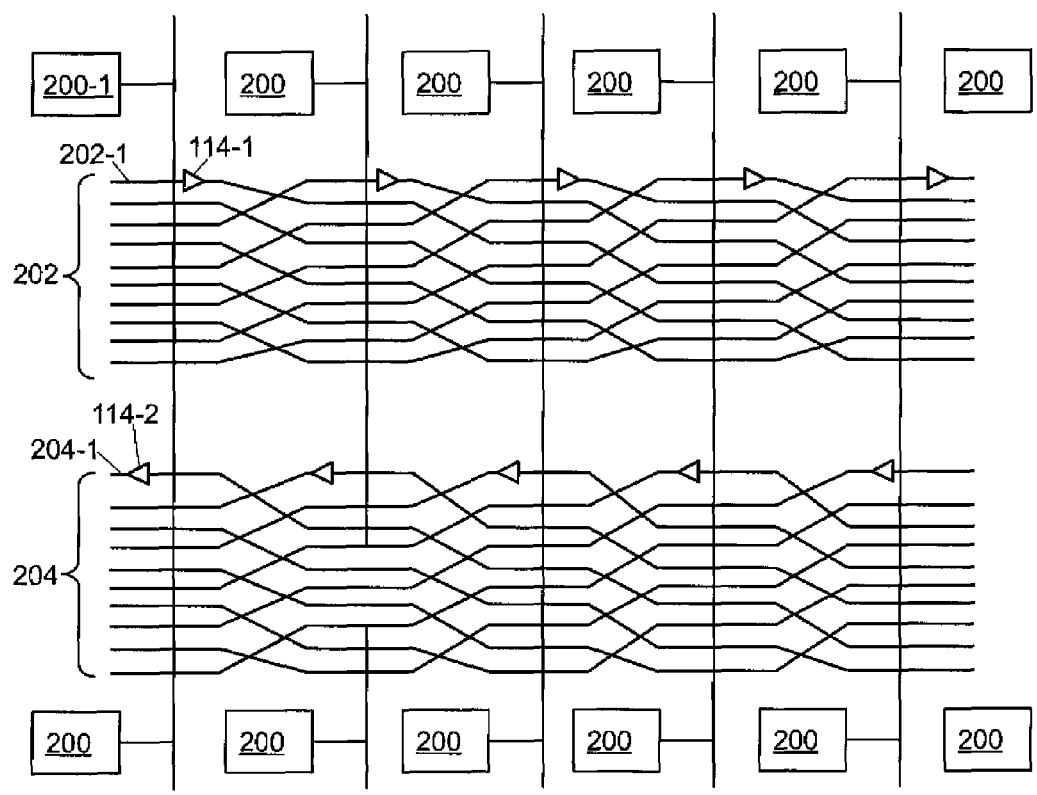
FIG. 3 illustrates schematically an arrangement of the long routing lines in a bus architecture according to the present invention.

In FIG. 3, a schematic diagram of logic tiles 200 in an FPGA and the arrangement of the horizontal long routing lines in a bus architecture in relation to the logic tiles according to the present invention are illustrated. In the bus architecture, horizontal long routing lines 202 for sending signals in a first direction and horizontal long routing lines 204 for sending signals in a second direction are illustrated. To most readily illustrate the present invention by avoiding an overly complicated drawing figure, only the buffers 114-1 and 114-2 and the horizontal routing net pairs corresponding to drawing FIG. 2 are depicted in FIG. 3, and the vertical routing nets and buffers are not depicted.

In the preferred embodiment, the horizontal long routing lines 202 and 204 in the bus architecture are all of the same length. However, the individual horizontal long routing lines 202 and 204 in the bus architecture do not start from the same place on the die. The individual horizontal long routing lines 202 and 204 are staggered so that each logic tile 200 in the FPGA logic layout, as described above and as understood by those of ordinary skill in the art, has one associated long horizontal routing line 202 in first direction and one associated long horizontal routing line in a second direction 204. For the logic tile 200-1, the set of parallel horizontal long lines having different directionality are indicated as 202-1 and 204-1.

Each individual routing net has a length equal to the tile distance between the driving repeater and receiving repeater, whereby in each tile, the position of the nets within a bus of N nets having N ordinal positions is changing by +2 or –2 ordinal positions, except the outermost and innermost ordinal positions, the $1^{st}$ and Nth ordinal positions, respectively, from where it changes by +1 or –1 positions. This rotation scheme ensures that an individual line will have two neighboring lines which are different in any tile position. This reduces any capacitive cross-talk problems. Cross-talk problems are known to happen when a long line has other long lines as direct neighbors over long distances, so that the individual capacitance between two neighboring nets may be a significant portion of its total net capacitance. A simultaneously switching signal on the neighboring line could slow down or even create glitches on a signal, which are know as cross-talk problems. The reshuffle pattern of the present invention makes sure that the total capacitance of an individual line is composed by a large number of small capacitances, each of them to a different net.

For the non-volatile memory cells described above as suitable for use according to the present invention, circuits for applying appropriate erase, programming and operating potentials to the floating gate devices and MOS transistors are well known to those of ordinary skill in the art and are therefore not described herein to avoid overcomplicating the disclosure and thereby obscuring the present invention.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A unidirectional routing repeater comprising:
a buffer having an input and an output, said output connected to a first routing line for transmitting a signal in a first direction,
a first programmable switch connected to said input,
a second programmable switch connected to said input,
a third programmable switch connected to said input; and
a fourth programmable switch connected to said input,
wherein said first programmable switch is connected to a second routing line for transmitting a signal in said first direction.

2. The routing repeater of claim 1, wherein said second programmable switch is connected to a third routing line for transmitting a signal in a second direction.

3. The routing repeater of claim 2, wherein said third programmable switch is connected to a fourth routing line for transmitting a signal in a third direction.

4. The routing repeater of claim 1, wherein said fourth programmable switch is connected to ground.

5. The routing repeater of claim 1 further including a fifth programmable switch connected to said input and to a separate routing line.

* * * * *